(12) United States Patent
Knippels et al.

(10) Patent No.: US 10,134,650 B2
(45) Date of Patent: Nov. 20, 2018

(54) APPARATUS AND METHOD FOR CUTTING A WAFER THAT IS SUBSTANTIALLY COVERED BY AN OPAQUE MATERIAL

(71) Applicant: ASM Technology Singapore Pte Ltd, Singapore (SG)

(72) Inventors: Guido Knippels, RA Schijndel (NL); Geert Ubink, TK's Hertogenbosch (NL); Jianfei Yang, AZ Eindhoven (NL); Eric Meng Meng Tan, AB Wageningen (NL); Marcel Boeren, BE Goirle (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/048,201

(22) Filed: Feb. 19, 2016

(65) Prior Publication Data

US 2017/0243796 A1  Aug. 24, 2017

(51) Int. Cl.
| | |
|---|---|
| *H01L 21/00* | (2006.01) |
| *H01L 21/66* | (2006.01) |
| *G05B 19/418* | (2006.01) |
| *H01L 21/67* | (2006.01) |
| *H01L 21/68* | (2006.01) |
| *H01L 21/78* | (2006.01) |
| *H01L 23/544* | (2006.01) |

(52) U.S. Cl.
CPC ............ *H01L 22/34* (2013.01); *G05B 19/418* (2013.01); *H01L 21/67092* (2013.01); *H01L 21/67259* (2013.01); *H01L 21/68* (2013.01); *H01L 21/78* (2013.01); *H01L 23/544* (2013.01); *G05B 2219/45031* (2013.01); *H01L 2223/5446* (2013.01)

(58) Field of Classification Search
CPC . H01L 21/78; H01L 21/681; H01L 27/14625; H01L 31/02327; H01L 2221/6834
See application file for complete search history.

(56) References Cited

U.S. PATENT DOCUMENTS

| | | | | |
|---|---|---|---|---|
| 4,213,117 A | * | 7/1980 | Kembo | H01L 23/544 250/559.3 |
| 7,211,370 B2 | * | 5/2007 | Sakaguchi | H01L 21/78 257/E21.599 |
| 8,053,279 B2 | * | 11/2011 | Farnworth | B28D 5/0064 438/113 |

* cited by examiner

*Primary Examiner* — Julio J Maldonado
*Assistant Examiner* — Andre' C Stevenson
(74) *Attorney, Agent, or Firm* — Ostrolenk Faber LLP

(57) ABSTRACT

A wafer cutting apparatus comprises a wafer positioning device for holding a wafer that is substantially covered with an opaque material such as molding compound and that has an exposed peripheral area, and for displacing the wafer relative to a wafer inspection system comprising a camera having a field of view. To perform visual data acquisition of said dicing street portions, the wafer is displaced such that a center of the camera's field of view follows a path along the exposed peripheral area of the wafer. A processing unit analyzes the visual data acquired for detecting or calculating locations and directions of the dicing streets. A wafer cutting tool cuts the wafer along straight lines between the dicing street portions which have been detected or calculated by the processing unit.

5 Claims, 10 Drawing Sheets

APPARATUS AND METHOD FOR CUTTING A WAFER THAT IS SUBSTANTIALLY COVERED BY AN OPAQUE MATERIAL

FIELD OF THE INVENTION

The present invention relates in general to the field of semiconductor manufacturing.

BACKGROUND OF THE INVENTION

Miniaturization of electronic components has led to various improvements in semiconductor technology to make electronic components ever-smaller. Such components may include simple components such as diodes, up to complex components such as integrated circuits. Apart from electronic components, mechanical components can also be manufactured using the same technology.

In the art of semiconductor technology, it is commonly known that a wafer of semiconductor material, typically silicon, is processed to form the components in a surface area of the wafer. The wafer is macroscopic, having a diameter ranging in the order of 20-300 mm, while the components are microscopic, typically having a size in the micrometer range. Each component, or complex of components, is made in a small wafer portion, with the various wafer portions being located at a small distance from each other. After the processing steps, the wafer is cut to separate the various wafer portions from each other, so that the components become available independent from each other. After separation, each separated wafer portion is referred to as a die, and the separation process is known as dicing. The present invention relates particularly to the field of wafer dicing.

The various wafer portions are typically arranged in a matrix pattern, separated by mutually orthogonal lanes, also indicated as "dicing streets". The separation process involves applying a cut in each dicing street. Evidently, it is desirable that the surface area of the wafer is used as efficiently as possible, therefore said dicing streets are very narrow, which makes the precision requirements for the dicing processing very demanding.

The cutting is executed in a cutting apparatus, that comprises a holder for holding the wafer and a cutting blade for cutting the wafer. In operation, the cutting blade makes the cut along a straight line in a cutting direction. For assuring that the cut is made in the correct position, the wafer must be accurately aligned with the cutting blade and the cutting direction. This involves the step of aligning the dicing streets of the wafer with reference directions of the cutting apparatus. These reference directions will typically be mutually orthogonal directions indicated as X and Y directions, but the scope of the present invention is not restricted to these details, and in principle it is possible that the wafers are cut along three or more different directions.

For aligning the dicing streets of the wafer with reference directions of the cutting apparatus, it is common practice to use a visual imaging system. A camera is arranged to view the wafer on the holder, and an image of the wafer (or a wafer portion) is displayed on a display screen. Reference lines that represent the said reference directions are also displayed on the display screen. In an initiation mode, a human operator manually manipulates the wafer such that the dicing streets displayed on the screen are accurately aligned with the reference lines on the screen. When the human operator is satisfied with the alignment, an image is taken of the wafer, and this image is stored in a data memory of the cutting apparatus.

In an operation mode, the cutting apparatus receives a new wafer to be cut. The cutting process essentially comprises three steps.

A first step is an alignment step, in which a control device fully automatically controls the holder to move the wafer (linear displacement and/or rotation) to such position that the instantaneous wafer image accurately corresponds to the stored image.

A second step is a determination step in which the exact positions of the dicing streets are determined by the control device. The dicing streets which extend in the X-direction (indicated as X-streets) are mutually parallel and thus have a mutual distance in the Y-direction (indicated as Y-pitch), which is equal for all pairs of X-streets. Likewise, the dicing streets which extend in the Y-direction (indicated as Y-streets) are mutually parallel and thus have a mutual distance in the X-direction (indicated as X-pitch), which is equal for all pairs of Y-streets. The X-pitch and the Y-pitch are known to the control device, or in any case the control device has information that defines approximation values for the X-pitch and the Y-pitch, but in practical conditions there may be slight variations. Thus, the control device controls the holder to displace the wafer in steps corresponding to the X-pitch and the Y-pitch, then, with the camera viewing the wafer, the control device performs an accurate alignment of the wafer so that the instantaneous wafer image again accurately corresponds to the stored image, and the thus obtained precise coordinates of the X-streets and Y-streets are stored in memory.

A third step is the actual cutting step. The control device controls the holder to displace the wafer to the positions determined in the second step and retrieved from memory, and performs the cutting operation.

It is to be noted that in a high-quality wafer, immediately after manufacture, the dicing streets are mutually parallel and have very accurate pitch. Thus, when the wafer has been correctly aligned in the cutting apparatus, the position of an X-street can be characterized as an Y-coordinate and the position of an Y-street can be characterized as an X-coordinate. Further, with a constant pitch over the wafer surface, it is not necessary to know all individual Y-coordinates of the X-streets and to know all individual X-coordinates of the Y-streets, since stepping from one X or Y street to its neighbour only requires to take a step equal to the pitch in the Y or X direction, respectively.

The known process as described above works well in practice. However, an essential feature of the known process is that in the determination step, the positions of dicing streets are determined somewhere in the central area of the wafer, and this requires that the dicing streets of the wafer are exposed to visual observation by the camera of the visual imaging system.

A special type of semiconductor dice is the so-called "molded dice". Their application is typically in the area of semiconductor packages, where two or more dice are stacked upon each other. These dice are provided with a non-conductive coating, containing for instance a plastic or an epoxy, and contact terminals that extend through the coating to contact the die. Manufacturing first involves separating the individual dice, such as by the prior art process as described above. Then a molding compound application step is performed, in which the molding compound is applied to the dice, typically in liquid form. The molding compound covers the top surface of the dice, and fills the cut open dicing streets between the dice. Then the molding compound solidifies or hardens.

In this stage, the molded dice together with the molding compound have the shape of a disc, which is termed a "molded wafer". Now the individual dice must be separated again, this time by cutting the molding compound that has filled the dicing streets. The cut to be made must follow the dicing streets; if it is desired that this cut be substantially narrower than the dicing streets, the cut is made by a laser.

The task to be performed, cutting the wafer, seems comparable to the task described above. It is however not possible to use the technique described above, because the upper side of the wafer is now covered with non-transparent molding compound and hence the dicing streets of the wafer are not available for visual observation by the camera of the visual imaging system.

Some prior art methods rely on visual indications visible to above the molding compound, and on an assumption that the dicing streets are arranged according to a perfect grid. However, on the one hand, alignment on the basis of such visual indications has already a limited accuracy, and on the other hand, while the dicing streets were indeed arranged according to a perfect grid on manufacture, this assumption does not hold true any more after the steps of cutting and applying the covering molding compound. Thus, these prior art methods lack accuracy.

As a partial solution to the above problem, it has already been proposed to remove a circumferential edge area of the molding compound, such as to expose the underlying end portions of the dicing streets. While this involves damaging and hence sacrificing the corresponding circumferential edge area of the wafer, this is in practice acceptable.

This prior art method allows for examining the wafer for finding the positions of the dicing streets. Better said, this prior art method allows for finding the end portions of the dicing streets. The dicing streets themselves may be considered to extend as respective straight lines between these end portions. However, this requires an accurate pairing of opposite end portions; even a slight mismatch will cause cuts to be made in an oblique manner and may ruin the wafer. An accurate pairing requires an accurate determination of position and direction of each dicing street; on the other hand, this determination should be done sufficiently fast, otherwise the throughput would become too low.

SUMMARY OF THE INVENTION

An objective of the present invention is to seek to provide a wafer cutting apparatus that overcomes the above problems and challenges. More particularly, the present invention aims to provide a wafer cutting apparatus that provides fast and accurate determination of the layout of the dicing streets in a wafer which is substantially covered by an opaque material, such as molding compound, at relatively low cost. The present invention also aims to provide a fast and accurate inspection method for detecting locations and directions of dicing streets of a wafer.

According to the invention, a wafer cutting apparatus comprises a wafer inspection system comprising a camera having a field of view; a positioning device operative to move the wafer and the wafer inspection system relative to each other, such that a centre of the camera's field of view follows a path along an exposed peripheral area of the wafer, so as to perform visual data acquisition of said dicing street portions; a processing unit operative to analyse the visual data acquired for detecting or calculating locations and directions of the dicing streets; a wafer cutting tool operative to cut the wafer along straight lines between the dicing street portions which have been detected or calculated by the processing unit.

In an embodiment with high processing speed and high throughput, the processing unit is operative to calculate coordinates where a centre of the camera's field of view is expected to cross a dicing street, and to obtain an image from the camera for visual data acquisition only when the centre of the camera's field of view reaches the calculated coordinates.

In an advantageous embodiment, the camera is a triggerable camera adapted to output acquired visual data signals only on receipt of a trigger signal, and the processing unit is adapted to send to the camera a trigger signal only when the centre of the camera's field of view reaches said calculated coordinates.

In an alternative advantageous embodiment, the camera is adapted to output acquired visual data signals continuously, and the processing unit is adapted to take one image only when the centre of the camera's field of view reaches said calculated coordinates.

In a preferred embodiment with increased throughput and accuracy, the apparatus comprises a controllable lighting device aimed at a position where the centre of the camera's field of view intersects the wafer surface; and the processing unit is adapted to control the lighting device to be normally OFF and to produce a short light flash only when the centre of the camera's field of view reaches said calculated coordinates. It is relatively easy and cost-efficient to control an LED lamp to produce a sufficiently short but bright light flash suitable for making sharp images of moving objects.

In this preferred embodiment, it is advantageous if the camera is a triggerable camera while the processing unit is adapted, shortly before the centre of the camera's field of view reaches said calculated coordinates, to send to the camera a first trigger signal to start receiving light and acquire visual data; wherein the processing unit is adapted, when the centre of the camera's field of view reaches said calculated coordinates, to send to the lighting device a second trigger signal causing the lighting device to produce a short light flash; and wherein the processing unit is adapted, shortly after the second trigger signal, to send to the camera a third trigger signal to stop receiving the light and to finalize and transmit the acquired visual data. Thus, effectively, the camera is sensitive for a longer time but the image is obtained from the light flash, which has high brightness and short duration, thus ensuring a sharp image. To enhance processing speed and throughput, it is then preferred that, between the first and third trigger signals, the travel of the camera along the camera path is continued. Although the camera is displaced in the time frame between the first and third trigger signals, the image obtained is sharp because of the short duration of the illumination.

In an embodiment, the wafer cutting apparatus is adapted to perform a street position calculation step, in which the positions and directions of extreme portions as determined during visual data acquisition are processed to provide paired start and end portions of all dicing streets, and to perform a dice separation step in which the central processing unit controls the positioning device and the wafer cutting tool to cut the wafer along straight lines between said paired start and end portions as calculated during street position calculation.

Advantageously, the positioning device may comprise a rotary alignment holder that during visual data acquisition of dicing streets is operative to rotate the wafer relative to the wafer inspection system. In an alternative embodiment, the positioning device may comprise an XY wafer holding table that during visual data acquisition of dicing streets is operative to displace the wafer relative to the wafer inspection system according to a circular path.

According to the invention, for detecting locations and directions of dicing streets of a wafer that has an exposed peripheral area where portions of the dicing streets are visible, an inspection method comprises the steps of: acquiring visual data of said dicing street portions while moving the wafer and a wafer inspection system relative to each other, wherein the wafer inspection system comprises a camera having a field of view, and wherein a centre of the camera's field of view follows a path along the said peripheral area; and analysing the visual data acquired for detecting or calculating the locations and directions of the dicing streets.

In an embodiment with high processing speed and high throughput, estimated coordinates are calculated where the centre of the camera's field of view should cross a dicing street, and an image is taken only when the centre of the camera's field of view reaches said estimated coordinates.

In a preferred embodiment with increased throughput and accuracy, a visual data acquisition process is started shortly before the centre of the camera's field of view reaches said estimated coordinates; when the centre of the camera's field of view reaches said estimated coordinates, a short light flash is produced to illuminate the wafer surface; and shortly after the light flash has been produced the visual data acquisition process is stopped. Thus, effectively, the camera is sensitive for a longer time but the image is obtained from the light flash, which has high brightness and short duration, thus ensuring a sharp image.

The step of moving the wafer and the wafer inspection system relative to each other during the step of acquiring visual data of said dicing street portions may conveniently be performed by rotating the wafer relative to the wafer inspection system using a rotary alignment holder. In an alternative embodiment, a fast and accurate XY wafer holding table is used for moving the wafer and the wafer inspection system relative to each other during the step of acquiring visual data of said dicing street portions.

The method of the invention is especially advantageous in case the wafer has a central area that is substantially covered by an opaque material, such as molding compound.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which.

DETAILED DESCRIPTION OF THE INVENTION

Figure 1:
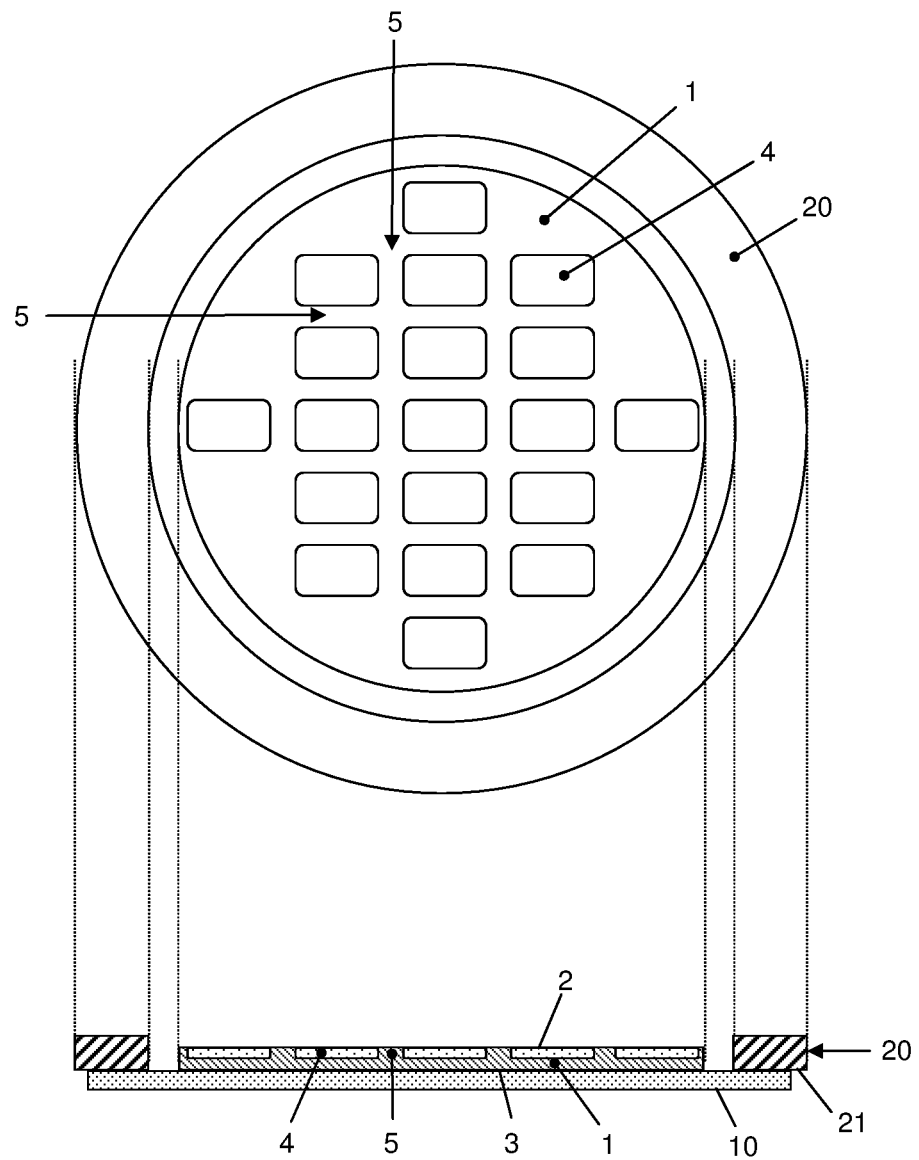
FIG. 1 schematically illustrates a primary wafer.

FIG. 1 schematically shows a top view (upper half) and a cross section (lower half) of a semiconductor wafer such as primary wafer 1. The wafer is an accurate high-quality output product of a wafer-making machine, and will in this stage be indicated as a "primary wafer" for distinguishing it from the wafer at a later stage.

The primary wafer 1 has a top surface 2 and an opposite bottom surface 3. In the top surface 2, the primary wafer 1 has component portions 4, which contain electronic components and which will be indicated as dice. The dice 4 are arranged according to a rectangular matrix pattern. Areas between the dice 4 are indicated as dicing streets 5; these areas will be indicated as "dicing streets" in the initial situation before cutting, but also after cutting when the dicing streets are cut open or filled with molding compound.

In order to be able to manipulate the primary wafer 1, the wafer has its bottom surface 3 adhered to a tape 10. A wafer ring 20 is arranged around the wafer 1, and has its bottom surface 21 adhered to a tape 10. The tape 10, which in any case covers the entire bottom surface 3 of the primary wafer 1, may be an adhesive tape.

Figure 2:
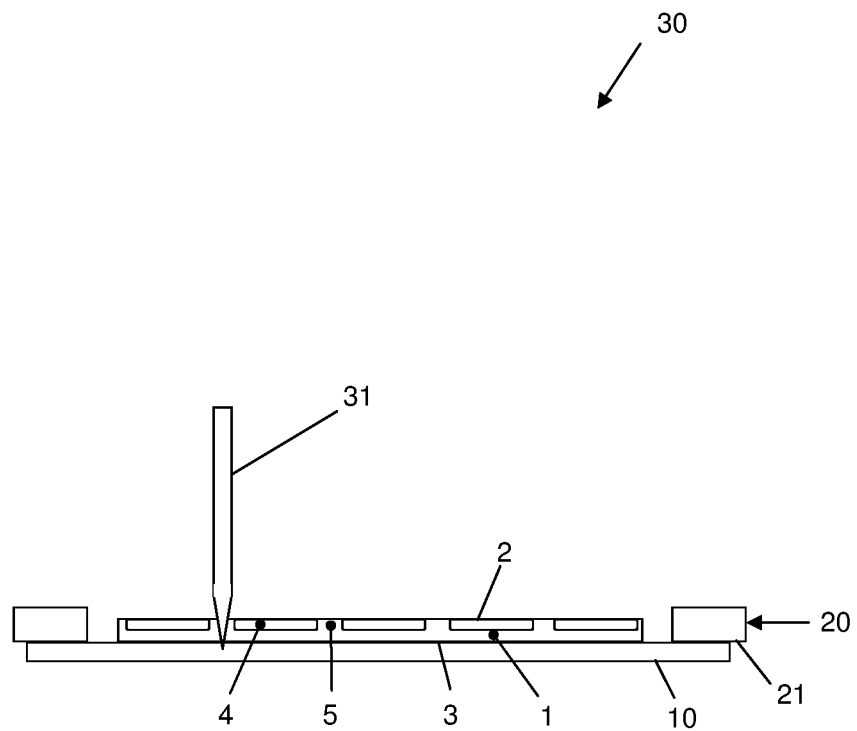
FIG. 2 schematically illustrates a cutting step.

To separate the individual dice 4, the primary wafer 1 is cut in a cutting apparatus 30 having a mechanical cutting blade 31, as schematically illustrated in FIG. 2. The cutting blade 31 approaches the primary wafer 1 from above, facing the top surface 2, and cuts with certainty through the entire thickness of the primary wafer 1. The cutting blade 31 may cut into the tape 10, but not entirely through it. The cuts are made in mutually perpendicular lines, following the dicing streets 5. It is noted that the width of the cuts in the dicing streets 5 may be in the order of about 40 µm, while the dimensions of the individual dice 4 may be in the range of about 200 µm to about 20 mm, with an exemplary typical size in the order of about 4 mm.

Figure 3:
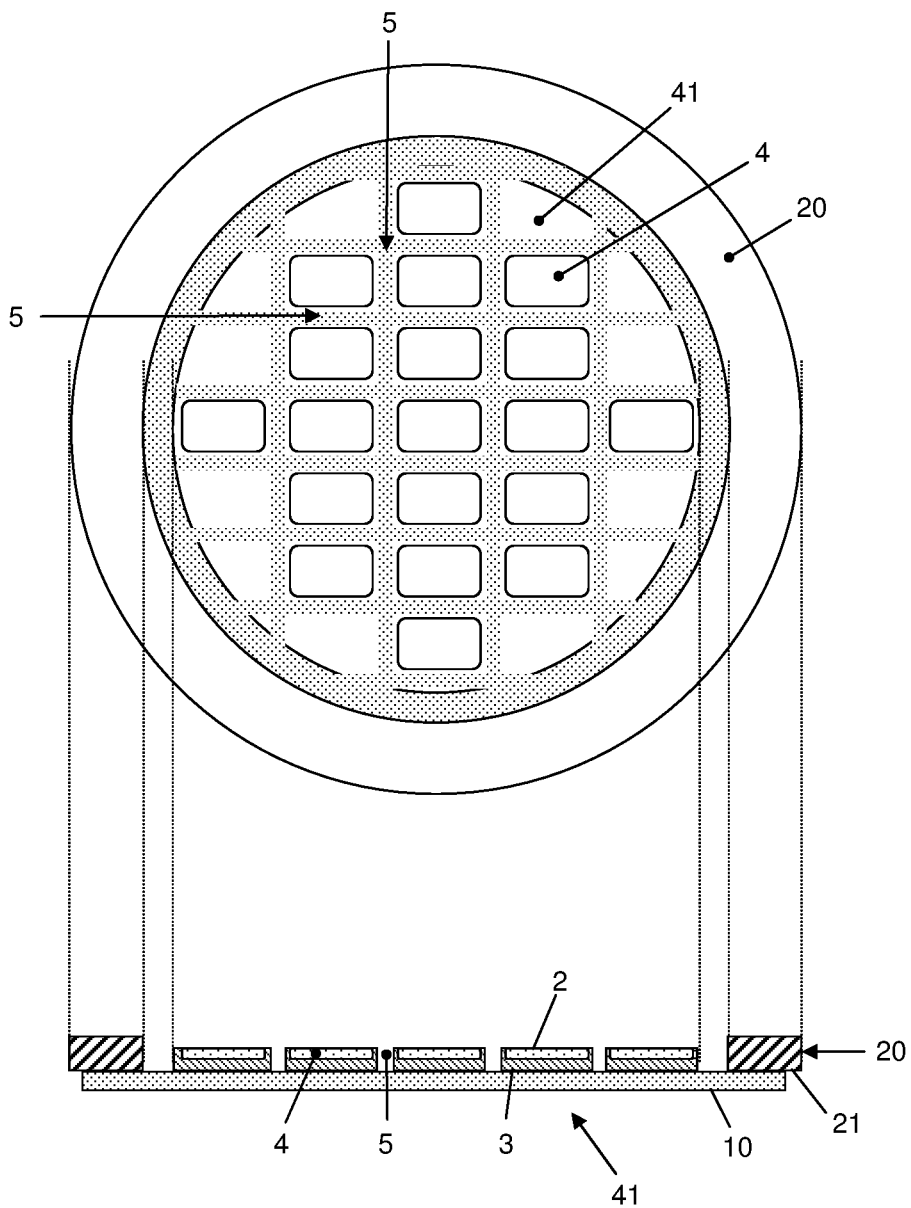
FIG. 3 schematically illustrates the primary wafer after the cutting step.

FIG. 3 is a figure comparable to FIG. 1, schematically illustrating the wafer after the cutting process has been completed. The wafer will now be indicated as a "cut wafer" 41. The figure shows that the dicing streets 5 have been cut open, so that the individual dice 4 are separated from each other. However, since the tape 10 covers the entire lower surface 3 the wafer, the individual dice 4 are substantially maintained in their original position and orientation with respect to each other and with respect to the wafer ring 20. The wafer ring 20 and the tape 10 act as carrier and holder for the primary wafer 1 and for the individual dice 4.

After separation, the combination of carrier 10, 20 and cut wafer 41 is removed from the cutting machine 30. Immediately thereafter, or after a delay which may be days or longer, the cut wafer 41 with the carrier 10, 20 is placed in a molding apparatus, where connective pads 52 are placed on the respective dice 4, and where an opaque material, such as a molding compound 53, is applied to completely cover the dice 4. The molding compound 53, which may for instance comprise a plastic, a resin or an epoxy, is applied in liquid state and completely fills the dicing streets 5, after which the molding compound 53 sets and hardens or cures.

The pads 52 extend through the molding compound 53 layer on the top surface 2, for electrical connectivity with the components in the dice 4.

Figure 4:
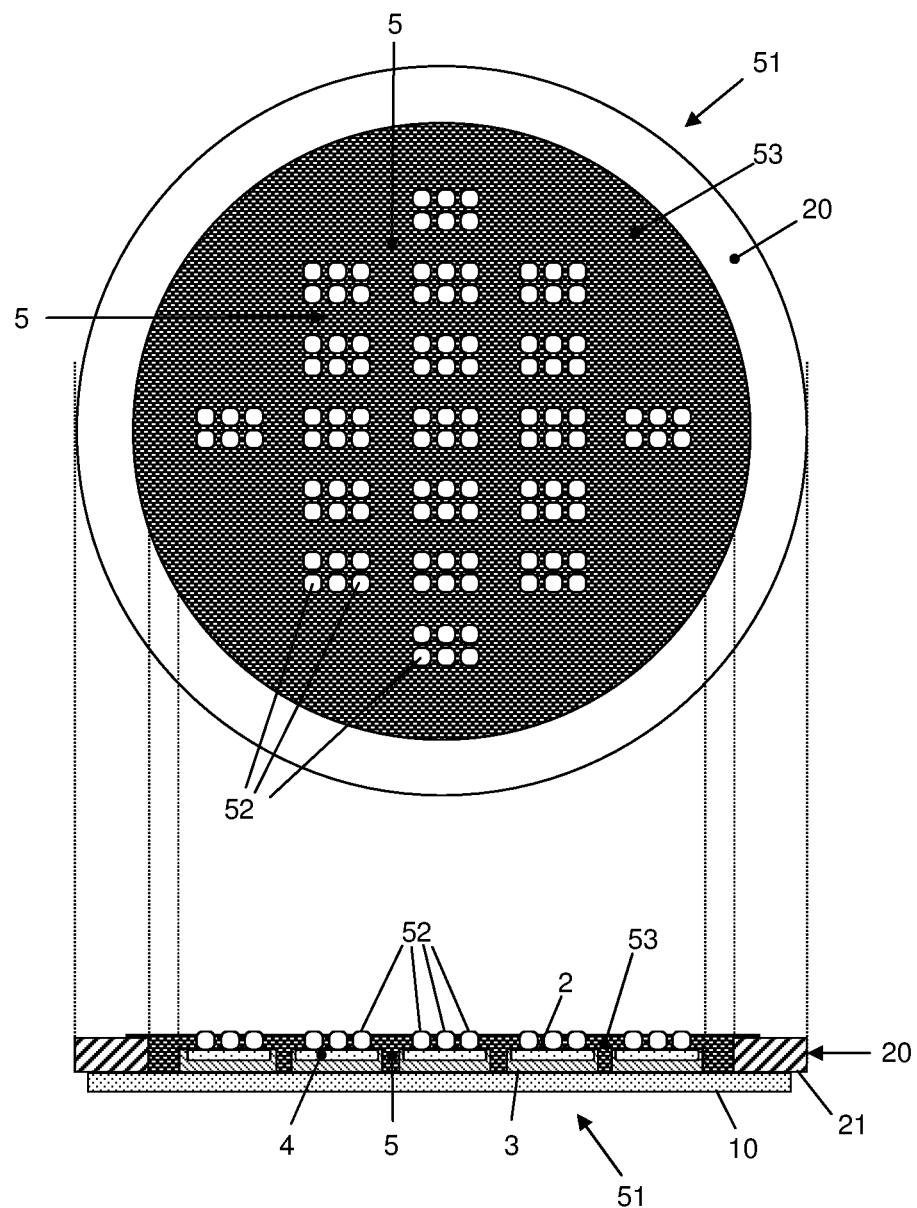
FIG. 4 schematically illustrates a molded wafer.

FIG. 4 is a figure comparable to FIG. 1, schematically illustrating the wafer after the molding process has been completed. The wafer will now be indicated as a "molded wafer" 51. The figure clearly shows that, seen from the top side, only the connective pads 52 can be seen, but the dicing streets 5 are not visible.

A next step that must be performed is the separation of the molding compound-covered dice 4. In contrast to the primary wafer 1, which was a highly accurate product where the pitches in X and Y directions where accurately constant over the surface of the wafer, the dice 4 of the molded wafer 51 do not have high positional accuracy. This is due to the processing steps that the wafer has experienced. Due to the cutting process, the dice may have shifted and/or rotated slightly. The molding process may have had a similar effect. Further, the cutting process is not as accurate as the lithographic manufacturing process of the wafer. During the cutting process, the progress of the cutting is monitored, and it is sometimes necessary to slightly adjust the position of the cutting blade, which leads to a step in the cut, and which leads to the cut dice not all having exactly the same size. While it is required that the separation step is performed which high accuracy, it is therefore not possible to rely on any positional data measured from the primary wafer 1. It is further not possible to derive the positions of the molding compound-filled dicing streets 5 from the visible connective pads 52 with sufficient accuracy.

Figure 5:
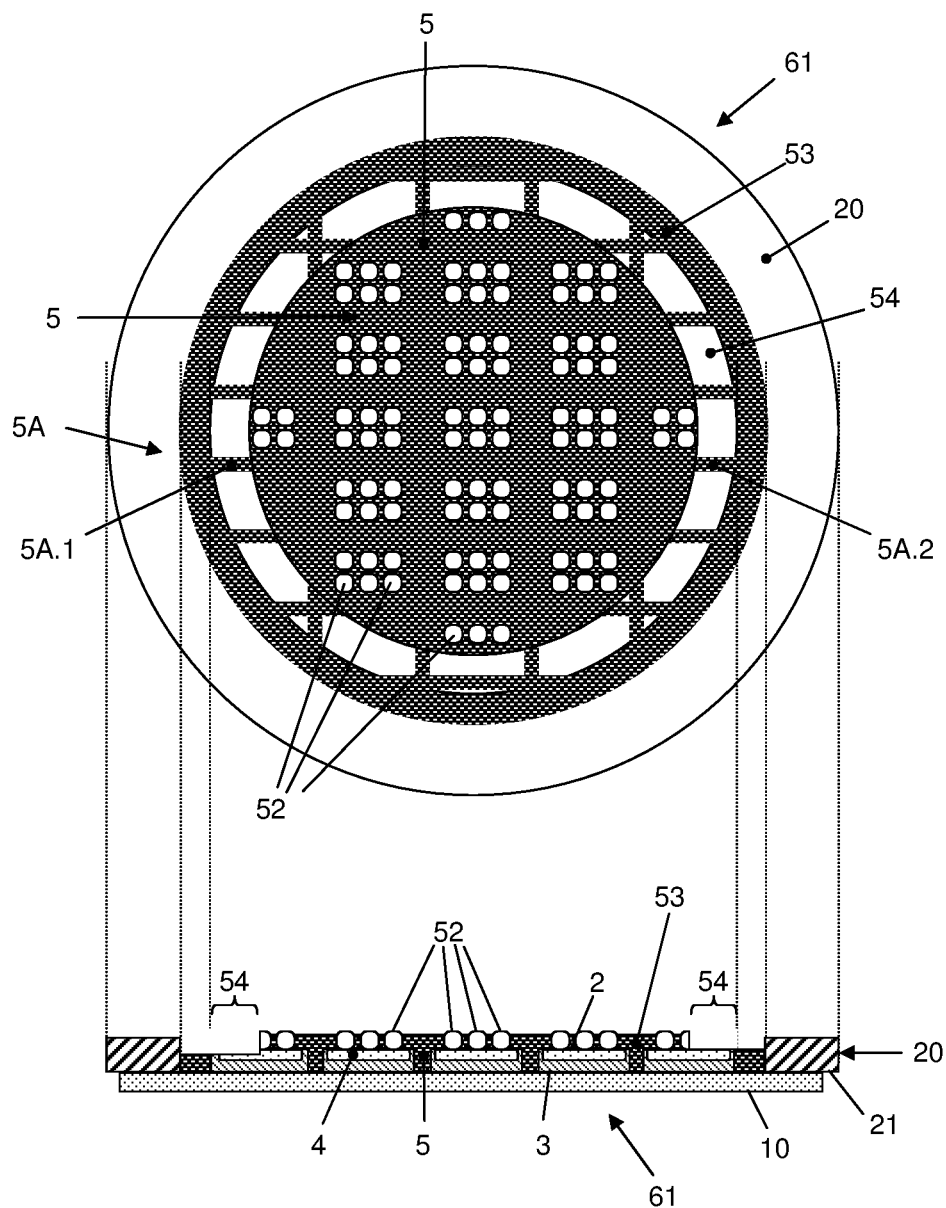
FIG. 5 schematically illustrates a molding compound removal step.

FIG. 5 is a figure comparable to FIG. 4, schematically illustrating a pre-processing step to be performed on the molded wafer 51. This pre-processing step is a molding compound removal step, in which the molding compound 53 covering the cut wafer 41 is removed in a peripheral area 54 of the molded wafer 51, which can be done using a standard rotary milling machine which is therefore not illustrated. In this peripheral area 54, the molding compound 53 is completely removed, and even an upper portion of the wafer material may be removed here, to assure that the remaining top surface with certainty is wafer material. It is to be noted that the cut open dicing streets 5 extend from wafer edge to wafer edge. Thus, as clearly illustrated in FIG. 5, as a result of the removal of the molding compound, extreme portions of the molding compound-filled dicing streets 5 (which will hereinafter also be indicated as "start portion" and "end portion", it being immaterial which one of the portions is indicated "start" or "end") are now exposed and visible from above, while the molding compound 53 within the dicing streets 5 provides good visual contrast with the neighbouring exposed wafer material. By way of example, for one individual dicing street 5A, a start portion is indicated at 5A.1 and an end portion is indicated at 5A.2.

In respect of each individual molding compound-filled dicing street 5, it is now possible to visually measure the exact positions of the respective start and end portions. Once the positions and directions of the start and end portions of the dicing streets are known with good accuracy, and once these start and end portions are correctly paired, it is possible to calculate the exact position of the intermediate dicing street portion as a straight line between the matching start and end portions and to then execute a cutting process, following the calculated straight lines. This cutting process can in principle be performed with any known type of cutting apparatus suitable for the job. The cutting apparatus may comprise a mechanical blade. However, for separating the molded dice, the cutting tool should only cut through molding compound and should not touch the wafer material, and considering that the molding compound-filled cut in the dicing streets is narrow, with a width in the order of 40 μm, the cutting tool should preferably comprise a laser beam.

Figure 6:
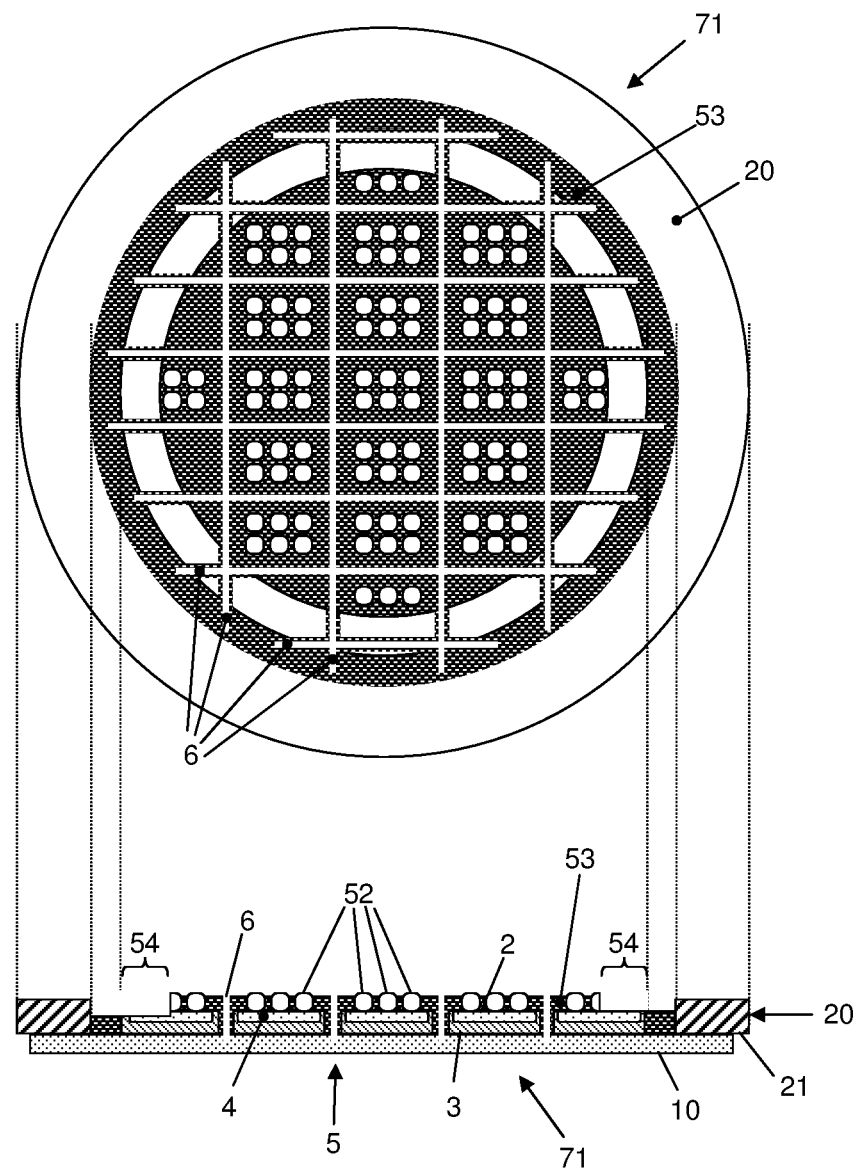
FIG. 6 schematically illustrates a cut molded wafer.

FIG. 6 is a figure comparable to FIG. 5, schematically illustrating the end result, in which the cuts made in the molding compound 53 within the dicing streets 5 are indicated at reference numeral 6.

In the following, the pre-processing step of removing molding compound will also be indicated as "clearing the wafer", and after clearing the wafer will be indicated as a "cleared molded wafer" 61. After the cutting process for separating the molded dice has been completed, the wafer will be indicated as a "cut molded wafer" 71.

Figure 7:
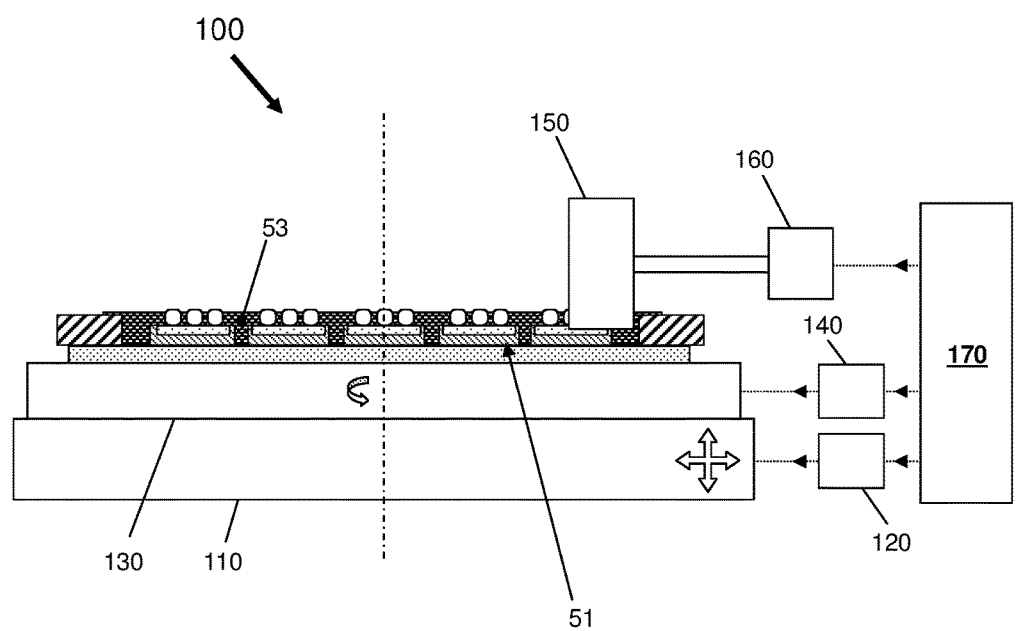
FIG. 7 is a diagram schematically illustrating an exemplary embodiment of a clearing stage.

FIG. 7 is a diagram schematically illustrating an exemplary embodiment of a clearing stage 100. The clearing stage 100 comprises an XYZ table 110 that is positionally adjustable along three orthogonal directions. Reference numeral 120 indicates an adjustment drive for the XYZ table 110. The clearing stage 100 comprises a rotary mount 130 mounted on the XYZ table 110, capable of holding a molded wafer 51 and rotating the wafer with respect to the XYZ table 110. Reference numeral 140 indicates a rotation drive for the rotary mount 130. The clearing stage 100 further comprises a rotary milling tool 150 and a milling drive 160 for the rotary milling tool 150. The milling tool 150 can be a standard milling tool and will not be explained here in further detail.

A control device 170 controls the adjustment drive 120, the rotation drive 140 and the milling drive 160 for suitably positioning the molded wafer 51 and the rotary milling tool 150 with respect to each other. Specifically, the rotary milling tool 150 is positioned to engage the peripheral edge area 54 of the upper surface of the molded wafer 51. Further, the rotary mount 130 is rotated such as to make the rotary milling tool 150 travel the peripheral circumference of the molded wafer 51. The width of the area 54 where the rotary milling tool 150 should engage, and the depth of molding compound 53 that should be removed or, alternatively, the height of wafer material that should remain may be set in advance or may be determined on the fly, for instance while using an inspection camera that observes the top surface of the wafer after milling It is noted that, instead of the rotary mount 130 being mounted on an XYZ table 110 and the milling tool being stationary, the milling tool 150 may be mounted on an XYZ table. Other variations are also possible.

It is further noted that the rotary milling tool 150 may be made to travel the peripheral circumference of the molded wafer 51 by combined X and Y movement of the XYZ table 110, in which case the rotary mount 130 may be omitted.

Figure 8:
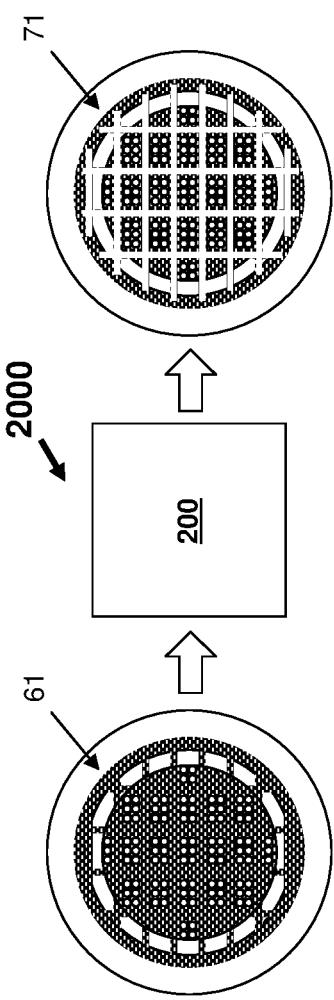
FIG. 8 is a block diagram schematically illustrating an embodiment of a wafer cutting apparatus according to the present invention.

FIG. 8 is a block diagram schematically illustrating an embodiment of a wafer cutting apparatus 2000 according to the present invention. The wafer cutting apparatus 2000 receives already cleared molded wafers 61, and comprises a cutting stage 200 that operates on a cleared molded wafer 61 to produce a cut molded wafer 71.

Figure 9:
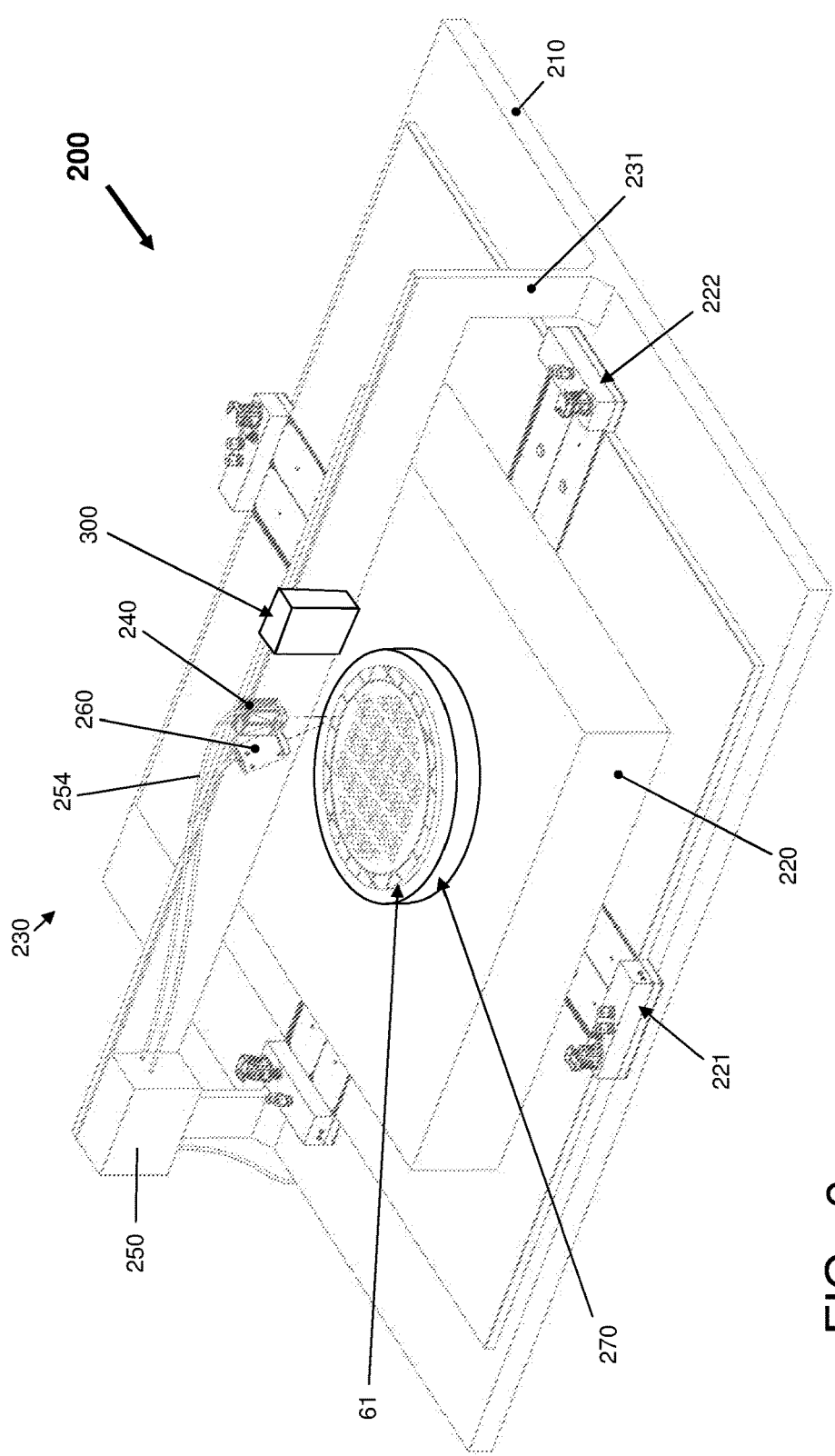
FIG. 9 is a schematic perspective view of an exemplary embodiment of a cutting stage according to the present invention.

FIG. 9 is a schematic perspective view of an exemplary embodiment of the cutting stage 200, which is comprised in the wafer cutting apparatus 2000. Reference numeral 210 indicates an apparatus frame. Reference numeral 220 indicates an XY wafer holding table, that is positionally adjustable along two orthogonal directions. Reference numeral 221 indicates an adjustment drive for the XY holding table 220 in a first direction, and reference numeral 222 indicates an adjustment drive for the XY holding table 220 in a second direction perpendicular to the first direction. Reference numeral 270 indicates a rotary alignment holder. A cleared molded wafer 61 is mounted on the rotary alignment holder, fixed tightly with respect to the rotary alignment holder by suitable mounting means not shown for sake of simplicity. The rotary alignment holder in turn is mounted on the XY holding table 220.

Reference numeral 230 generally indicates a visual wafer inspection system that comprises a camera 240. Reference numeral 231 indicates a mounting bridge mounting the camera 240 in a position above the cleared molded wafer 61. Reference numeral 250 indicates a central processing unit. The central processing unit 250 may be located in any suitable position, but is here shown as being mounted on the mounting bridge 231 as well. Reference numeral 254 indicates a communication cable between the central processing unit 250 and the camera 240, for supplying power to the camera 240 and/or for exchanging data communication between the central processing unit 250 and the camera 240. The central processing unit 250 also controls the rotary alignment holder 270 and the adjustment drives 221 and 222 for the XY holding table 220.

Figure 10:
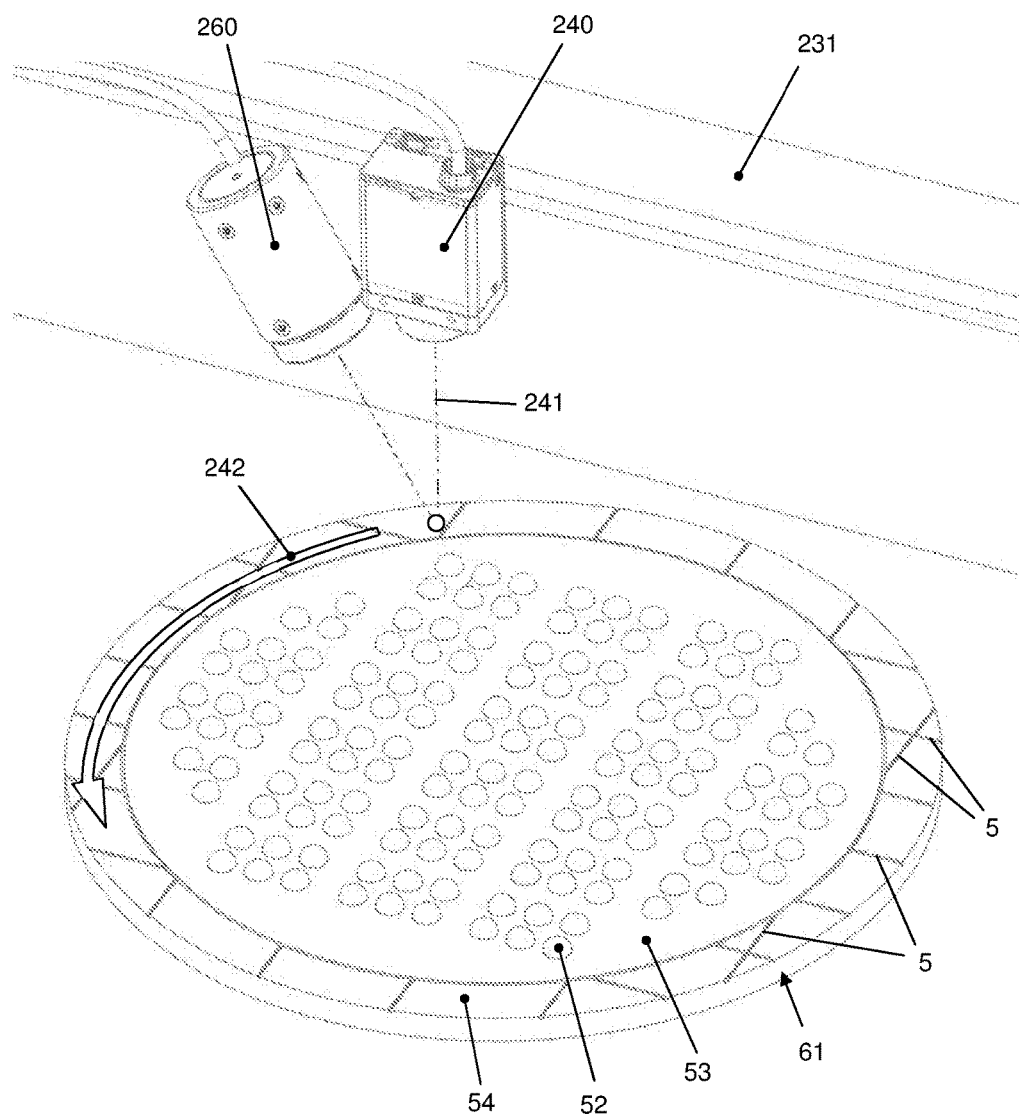
FIG. 10 shows on a larger scale details of the cutting stage of FIG. 9.

FIG. 10 shows the camera 240 and the cleared molded wafer 61 on a larger scale. The camera 240 is facing downwards; dotted line 241 indicates the centre of the field of view of the camera. It can be seen that the camera's centre of the field of view coincides with the wafer's peripheral area 54, where the molding compound 53 has been removed and where the molding compound-filled dicing streets 5 are visible. A lighting device 260, for instance an LED lamp, illuminates the portion of the wafer's peripheral area 54 under the camera 240. The camera 240 produces images of the wafer's peripheral area 54, in which the molding compound-filled dicing streets 5 have good contrast with the surrounding wafer material so that the borders between dicing streets and wafer material are easily recognizable.

In operation, the central processing unit 250 first performs a visual data acquisition step. The central processing unit 250 controls the adjustment drives 221 and 222 for the XY holding table 220 such that the XY holding table 220 makes a generally circular movement, such that, with respect to the wafer 61, the projection on the wafer 61 of the camera's centre of the field of view 241 travels the wafer's peripheral area 54 along the wafer's circumference, as indicated by an arrow 242, over an angular distance of at least 360°; this will hereinafter be indicated as the camera path 242. In the mean time, the camera 240 produces image signals which are received and analysed by the central processing unit 250. The central processing unit 250 is provided with image processing software, adapted to analyse the camera images for the presence of molding compound-filled dicing streets 5. At all times, the central processing unit 250 is aware of the exact XY position of the wafer 61, in other words the angular position of the camera 240 and of the camera's centre of the field of view 241. The central processing unit 250 is adapted to correlate the momentary camera image with the momentary XY position of the wafer 61, and to calculate the exact position and direction of the detected dicing street 5 portion, and/or to calculate the pitch between neighbouring dicing streets.

With the visual data acquisition step completed, when the camera 240 has scanned the wafer's peripheral area 54 over at least 360°, the central processing unit 250 performs a street position calculation step in which the positions and directions of the measured start and end portions of the dicing streets 5 are processed to find matching start and end portions, and the directions of the dicing streets and the pitch between neighbouring dicing streets are calculated.

It is possible for the camera 240 to continuously generate camera images, which are continuously analysed by the central processing unit 250. In this respect, "continuously" means at a relative high frequency. This involves however the necessity to scan every image for the presence of data patterns that could indicate a dicing street, which in turn, depending on the computational power of the central processing unit 250, will slow down the central processing unit 250 and will hence reduce throughput. A further elaboration of the invention involves a technique for improving the throughput.

In this further elaboration, intelligent use is made of auxiliary information that defines expected, first approximation predictions for the positions of the dicing streets. This auxiliary information may include information defining the type of wafer, which will be associated with a dice pattern and hence a dicing street pattern.

In a training phase, an operator will manually align a wafer with the X and Y directions of the XY holding table 220. When the operator is satisfied, the camera 240 captures a representative image from a suitably selected portion of the wafer 61, showing connective pads 52. Further, the operator inputs values for the pitch in X and Y directions, as well as an identifier for this type of wafer. These data are input into a memory associated with the central processing unit 250. In an operational phase, the wafer cutting apparatus 2000 receives a new wafer 61 having a known identifier. Based on this identifier, the central processing unit 250 retrieves from memory the representative image, and, while observing the wafer with the camera 240, controls the rotary alignment holder 270 to rotate the wafer 61 such that a momentary image corresponds to the representative image. The wafer is now approximately aligned, and the positions/pitches of the dicing streets are approximately known.

The central processing unit 250 now calculates, or has calculated in advance, estimated camera positions where the camera's centre of the field of view 241 should cross a dicing street. The central processing unit 250 controls the adjustment drives 221 and 222 for the XY holding table 220 such that the camera path 242 is traveled at relatively high speed. During this travel, the camera 240 normally does not produce any images, so the central processing unit 250 does not need to process any images. Alternatively the camera 240 may continue to process images but the central processing unit 250 ignores the data input. Only at those moments in time when the camera's centre of the field of view 241 should approximately cross a dicing street, as calculated by the central processing unit 250 on the basis of said estimation, a camera image is processed by the central processing unit 250.

This can be implemented by the central processing unit 250 triggering the camera to send an image, or by the central processing unit 250 taking one image from a continuous stream of camera images.

In principle, it is possible that the camera image is taken while the camera is still moving with respect to the wafer. However, cost-efficient CCD cameras have a relatively long shutter time which reduces accuracy. It is possible to use a high-speed camera, but this is rather costly. One solution to overcome this problem is to halt the camera displacement and hold the camera in steady position while the image is being taken, but this reduces the scan speed and hence reduces the throughput.

In a preferred embodiment, the lighting device 260 is controlled by the central processing unit 250 to be normally OFF and to produce a short light flash at those moments in time when the camera's centre of the field of view 241 should approximately cross a dicing street. It is relatively easy and cost-efficient to control an LED lamp to produce a sufficiently short but bright light flash suitable for making sharp images of moving objects. It is similar to technology as used in photographic cameras, and a more detailed description is omitted here.

In a further preferred elaboration, the camera 240 is triggered by the central processing unit 250 to capture a single image. The central processing unit 250 first triggers the camera 240 to start receiving light and produce an image, then triggers the lighting device 260 to produce a light flash, and finally triggers the camera 240 to stop receiving the light and to finalize and transmit the image. During this image capturing, the camera path 242 traveled by the camera is continued, at relatively high speed, but nevertheless the camera produces a sharp image of the corresponding dicing street.

In this procedure proposed by the present invention, if the dicing street is located exactly at the position estimated (calculated) by the central processing unit 250, this dicing street will be located exactly in the centre of the camera image sent to the central processing unit 250, which will make processing time by the central processing unit 250 short: it will be relatively fast for the central processing unit 250 to identify the dicing street concerned. Even if there is some shift of the dicing street with respect to the estimated position, the exact position will not be very far away from the estimated position, so in any case it will not be necessary for the central processing unit 250 to scan the entire camera image. It is noted that the camera's field of view, at the wafer surface, has a diameter of about 1 mm, so that scanning an entire image would take a lot of time.

With the street position calculation step completed, the cutting stage 200 now performs the actual cutting process for dice separation. For this purpose, the cutting stage 200 comprises a wafer cutting tool 300 controlled by the central processing unit 250. In FIG. 9, the wafer cutting tool 300 is shown only schematically. Further, FIG. 9 shows the wafer cutting tool 300 as being mounted to the bridge 231 too. In the preferred embodiment, the wafer cutting tool 300 is a laser beam cutting tool. The central processing unit 250 controls the XY holding table 220 and the wafer cutting tool 300 such that the wafer 61 is cut along straight lines according to the street positions and directions and/or street pitches as calculated in the street position calculation step.

It is noted that the process of die separation by laser beam cutting is a process that is known per se, and a further detailed description is omitted here. A normal aspect of such process is that, once a start point and an end point are determined, the apparatus is capable of making a linear cut between the start point and the end point. The special feature of the present invention is the determination of the respective start points and end points with high accuracy and high speed at moderate costs.

It should be clear to a person skilled in the art that the present invention is not limited to the exemplary embodiments discussed above, but that several variations and modifications are possible within the protective scope of the invention as defined in the appended claims. For instance, the camera can be made to scan the wafer's edge area by using the rotary holder 270 to rotate the wafer.

While the invention has been described for an example of a molded wafer, where the central wafer area is covered with molding compound and hence not visible, the application of the invention is not limited to such type of wafer. The key of the invention is a method for determining the positions of dicing streets by determining the positions of end portions of dicing streets at the peripheral edge area of the wafer. Once these positions of end portions of dicing streets are known, the dicing streets themselves can be assumed to extend as straight lines between these end portions. The method can be useful if the central wafer area is not available for determining the positions of dicing streets for any other reason, and can also be used as an alternative determination method even if the central wafer area is available for determining the positions of dicing streets.

Even if certain features are recited in different dependent claims, the present invention also relates to an embodiment comprising these features in common. Even if certain features have been described in combination with each other, the present invention also relates to an embodiment in which one or more of these features are omitted. Features which have not been explicitly described as being essential may also be omitted. Any reference signs in a claim should not be construed as limiting the scope of that claim.

The invention claimed is:

1. An inspection method for detecting locations and directions of dicing streets of a wafer, wherein the wafer has dicing streets, wherein portions of the dicing streets in a central area of the wafer are covered by an opaque material, and the wafer having an exposed peripheral area where only portions of the dicing streets not covered by the opaque material are visible, the method comprising the steps of:
    acquiring visual data of said dicing street portions in said exposed peripheral area while moving the wafer and a wafer inspection system relative to each other, wherein the wafer inspection system comprises a camera having a field of view, said wafer and said inspection system being moved so that a centre of the camera's field of view follows a path along said peripheral area of the wafer where the dicing streets are visible; and
    analysing the visual data acquired for detecting and calculating therefrom the locations and directions of the dicing street portions in the central area of the wafer covered by the opaque material.

2. The inspection method according to claim 1, wherein estimated coordinates are calculated where the centre of the camera's field of view should cross a dicing street, and wherein an image is taken only when the centre of the camera's field of view reaches said estimated coordinates.

3. The inspection method according to claim 1, wherein the step of moving the wafer and the wafer inspection system relative to each other during the step of acquiring visual data of said dicing street portions comprises the step of rotating the wafer relative to the wafer inspection system using a rotary alignment holder.

4. The inspection method according to claim 1, wherein the step of moving the wafer and the wafer inspection system relative to each other during the step of acquiring visual data of said dicing street portions comprises the step of displacing the wafer relative to the wafer inspection system using an XY wafer holding table.

5. A method for cutting a wafer that has dicing streets, a central area of the wafer being covered by an opaque material and the wafer having an exposed peripheral area where only portions of the dicing streets not covered by the opaque material are visible, the method comprising an inspection method according to claim 1, and further comprising a dice separation step in which the wafer is cut along straight lines between the detected and calculated dicing street portions.

* * * * *